(12) United States Patent
Cok

(10) Patent No.: US 7,948,178 B2
(45) Date of Patent: May 24, 2011

(54) HERMETIC SEAL

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 203 days.

(21) Appl. No.: 12/397,418

(22) Filed: Mar. 4, 2009

(65) Prior Publication Data

US 2010/0225231 A1 Sep. 9, 2010

(51) Int. Cl.
*H05B 33/04* (2006.01)
(52) U.S. Cl. .......................................... 313/512; 257/434
(58) Field of Classification Search .................... 257/40, 257/72, 98–100, 642–643, 759; 313/582–587, 313/414, 441–460, 495–497, 498–512, 293–304, 313/306, 309–310, 346, 351, 355; 315/169.1, 315/169.3; 427/58, 64, 66, 532–535, 539; 428/690–691, 917; 438/26–29, 34, 82; 445/24–25; 345/37, 41, 60, 71
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang | |
| 5,882,761 A | 3/1999 | Kawami et al. | |
| 6,226,890 B1 | 5/2001 | Boroson et al. | |
| 6,589,675 B2 | 7/2003 | Peng | |
| 7,202,602 B2 | 4/2007 | Anandan | |
| 2002/0125484 A1 | 9/2002 | Silvernail et al. | 257/79 |
| 2003/0122476 A1 | 7/2003 | Wang et al. | |
| 2003/0127976 A1 | 7/2003 | Kim et al. | |
| 2005/0269940 A1 | 12/2005 | Nishikawa et al. | 313/500 |
| 2009/0120684 A1 | 5/2009 | Kasai et al. | 174/520 |

FOREIGN PATENT DOCUMENTS

| | | |
|---|---|---|
| EP | 1 571 704 A1 | 9/2005 |
| WO | WO 00/08899 | 2/2000 |
| WO | WO 2006/077974 A1 | 7/2006 |

*Primary Examiner* — Nimeshkumar D Patel
*Assistant Examiner* — Donald L Raleigh
(74) *Attorney, Agent, or Firm* — Morgan, Lewis & Bockius LLP

(57) ABSTRACT

Hermetic seal for a device includes a substrate. A first strip on the substrate has a first surface wettability and a second strip on the substrate has a second surface wettability different from the first surface wettability. The seal further includes a first cover strip having the first surface wettability spaced from the first substrate strip and a second cover strip having the second surface wettability spaced from the second substrate strip in contact with the first cover strip. A sealing member wets and adheres to the first substrate and cover strips but not the second substrate and cover strips.

20 Claims, 4 Drawing Sheets

HERMETIC SEAL

FIELD OF THE INVENTION

The present invention relates to hermetic seals for protecting devices from moisture.

BACKGROUND OF THE INVENTION

There are a number of devices that are moisture sensitive. A particular class of devices is an organic light-emitting diode device (OLED). Such devices commonly include a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing, and capability for full-color flat emission displays. Tang et al. described this multi-layer OLED device in U.S. Pat. Nos. 4,769,292 and 4,885,211.

A common problem with OLED displays is sensitivity to moisture. Typical electronic devices require humidity levels in a range of about 2500 to below 5000 parts per million (ppm) to prevent premature degradation of device performance within a specified operating or storage life of the device. Control of the environment to this range of humidity levels within a packaged device is typically achieved by encapsulating the device or by sealing the device and a desiccant within a cover. Desiccants such as, for example, molecular sieve materials, silica gel materials, and materials commonly referred to as Drierite materials, are used to maintain the humidity level within the above range. Particular highly moisture-sensitive electronic devices, for example, organic light-emitting devices (OLED) or panels, require humidity control to levels below about 1000 ppm and some require humidity control below even 100 ppm.

Numerous publications describe methods or materials for controlling humidity levels within enclosed or encapsulated electronic devices. Kawami et al., in U.S. Pat. No. 5,882,761, has taught the use of a desiccant layer over the organic layers of an OLED display between the substrate and the top seal. Boroson et al., in U.S. Pat. No. 6,226,890, disclose the use of a castable blend of desiccants with a suitable binder. Kim et al. in US 2003/0127976 A1 teach the use of two sealants surrounding an OLED device. While this can be a way to reduce the likelihood of sealant failure, it is no more effective at reducing moisture transmission rate into the device than would be a single, wider sealant. Wang et al. in US 2003/0122476 A1 show the use of two seals surrounding an OLED device with a desiccant between the two seals, but no desiccant inside the enclosure that contains the OLED device. Peng in U.S. Pat. No. 6,589,675 B2 also teaches the use of two seals with a desiccant between them. It is also known to seal an OLED device with a metal seal, for example as described in U.S. Pat. No. 7,202,602.

The methods described in the above references rely on the seal between the substrate and the enclosure to limit the rate of water permeation and require sufficient volume within the enclosure to hold enough desiccating agent to absorb moisture for the entire lifetime of the device. These limitations can require very wide seals, and thus wide borders beyond the display area, to prevent the rate of moisture permeation from exceeding the rate of moisture absorption by the desiccating agents. Such an arrangement can require large or deep enclosures to hold sufficient quantities of desiccating agent. For top emitting OLED devices in particular, this enclosure size requirement can be a significant issue since most desiccating agents are not transparent, and therefore cannot be located over the emitting areas of the OLED. For top emitting OLED devices, desiccating agents must typically be placed outside the display area but still inside the enclosure, resulting in large borders beyond the display area. It is desirable to maintain small borders beyond the display area of OLED devices to minimize the size of a given device and to maximize the number of devices produced on a given mother glass substrate during manufacturing.

Therefore, there still remains the need to reduce moisture transmission rate into highly moisture-sensitive devices, such as OLED devices, in a way that does not add to the size of the border required beyond the display area of an OLED device.

SUMMARY OF THE INVENTION

In accordance with the invention, there is provided, a hermetic seal for a device, comprising:

a) a substrate having an interior substrate surface, an exterior substrate surface, and the device being formed within the perimeter over the interior substrate surface;

b) a first substrate strip having a first surface wettability located on the interior substrate surface between the device and the perimeter;

c) a second substrate strip having a second surface wettability different from the first surface wettability located on the interior substrate surface between the device and the first substrate strip and in contact with the first substrate strip;

d) a first cover strip having the first surface wettability spaced from the first substrate strip within the perimeter;

e) a second cover strip having the second surface wettability spaced from the second substrate strip in contact with the first cover strip;

f) a sealing member that wets the first substrate and cover strips but not the second substrate and cover strips, adhered to the first substrate and cover strips having the first surface wettability and does not adhere to the second substrate and cover strips having the second surface wettability; and g) a cover disposed over the first and second cover strips.

Advantages

It is an advantage of this invention that it reduces the level of moisture permeation into moisture-sensitive devices while providing a narrow seal of a controllable width. The sealing member is particularly effective because of its relationship with strips having controlled wettability to thereby provide reduced moisture permeation in a narrow, controllable seal.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels or a lighting device comprising organic light-emitting diodes having organic materials. The term "top-emitting" refers to display devices in which light is primarily emitted not through the substrate upon which they are deposited but through a cover opposite to the substrate, and are viewed through the side opposite to the substrate. The term "highly moisture-sensitive electronic device" is employed to designate any electronic device that is susceptible to a measurable degradation of device performance at ambient moisture levels greater than 1000 ppm. The term "substrate" is employed to designate organic, inorganic, or combination organic and inorganic solids on which one or more highly moisture-sensitive electronic devices are fabricated. The term "sealing material" is employed to designate organic, inorganic, or combination organic and inorganic materials used to bond encapsulation enclosures to substrates and to protect one or more highly moisture-sensitive electronic devices from moisture by preventing or limiting moisture permeation through the sealing materials. A sealing member is an element formed between a substrate and cover that includes sealing materials preventing the ingress of environmental contaminants. The term "desiccant" is employed to designate organic or inorganic materials used to physically or chemically absorb or react with moisture that would otherwise damage the highly moisture-sensitive electronic devices.

Figure 1:
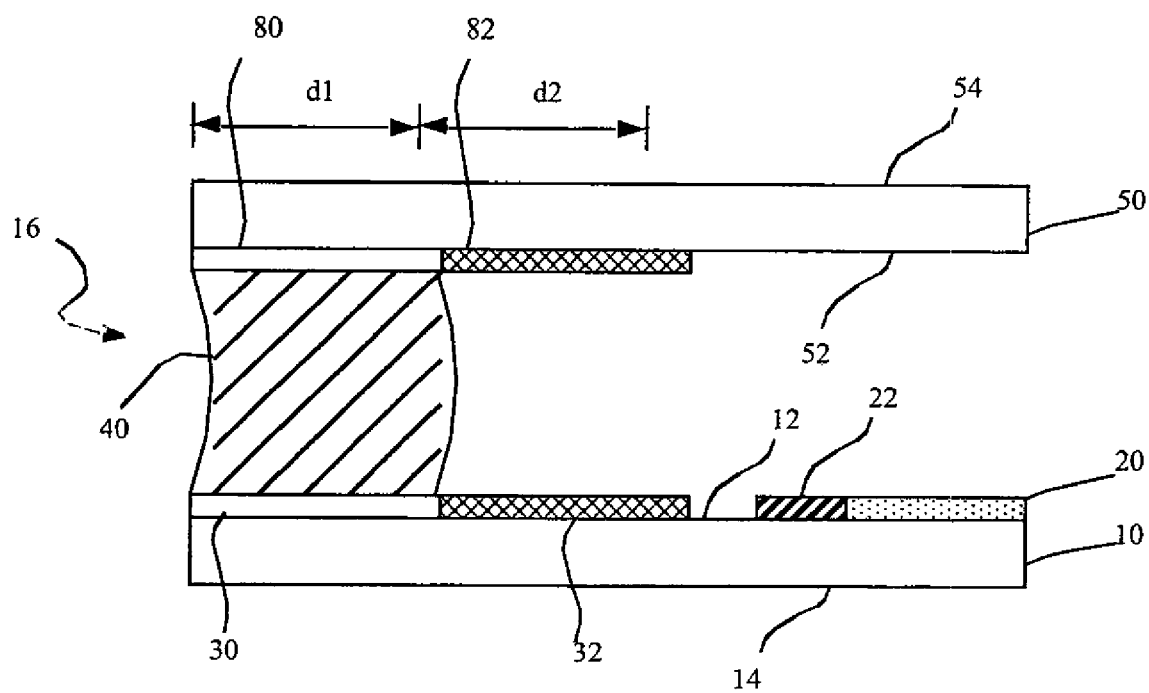
FIG. 1 shows a partial cross-section of the edge of an OLED device according to an embodiment of the present invention.

Referring to FIG. 1, in an embodiment of the present invention a hermetic seal for a device comprises a substrate 10 having an interior substrate surface 12, an exterior substrate surface 14, an edge 16 defining the perimeter of the substrate 10, and the device being formed within the perimeter over the interior substrate surface 12. A first substrate strip 30 having a first surface wettability is located on the interior substrate surface 12 between the device and the perimeter. In a preferred embodiment of the present invention, the first substrate strip 30 is in contact with at least a portion of the edge 16, and extends a first substrate distance d1 from the edge 16 and can extend around the entire perimeter. However, it is not necessary that the first substrate strip extend all the way out to the edge 16 or extend around the entire perimeter. A second substrate strip 32 having a second surface wettability different from the first surface wettability is located on the interior substrate surface 12 between the device and the first substrate strip 30 and in contact with the first substrate strip 30. In a preferred embodiment of the present invention, the second substrate strip 32 extends a second substrate distance d2 from the first distance d1 from the edge 16. A protective cover 50 having an interior cover surface 52, an exterior cover surface 54, and an edge corresponding to the substrate edge 16; the interior cover surface 52 faces the interior substrate surface 12. A first cover strip 80 having the first surface wettability is spaced from the first substrate strip 30 within the perimeter and is located on the interior cover surface 52. In a preferred embodiment of the present invention, the first substrate strip 30 extends a first cover distance d1 from the edge 16. A second cover strip 82 having the second surface wettability spaced from the second substrate strip 32 within and in contact with the first cover strip 80 is located on the interior cover surface 52. In a preferred embodiment of the present invention, the second cover strip 82 extends a second cover distance d2 from the first distance d1 from the edge 16. A sealing member 40 that wets the first substrate and cover strips 30, 80 but not the second substrate and cover strips 32, 82 is located along the edge 16 and in contact with both the first substrate strip 30 and first cover strip 80. The sealing member 40 extends a distance from the edge 16 less than or equal to the first substrate distance d1 and adhered to the first substrate strip 30 and first cover strip 80 having the first surface wettability and not adhered to the second substrate strip 32 and second cover strip 82 having the second surface wettability. The width of the seal can be controlled by adjusting the distance d1. The distance d1 is chosen to be large enough that the sealing member 40 provides adequate sealing protection to the OLED device for the application intended.

According to embodiments of the present invention, the seal member material wets the first cover and first substrate strips 80, 30 and not the second cover and second substrate strips 82, 32. However, it is not necessary that the first cover and first substrate strips 80, 30 have an identical wettability, nor that the second cover and second substrate strips 82, 32 have an identical wettability. It is only necessary that the first substrate strip 30 be more wettable than the second substrate strip 32 and that the first cover strip 80 be more wettable than the second cover strip 82 by the material comprising the sealing member 40. Likewise, the distance d1 on the cover 50 need not be identical to the distance d1 on the substrate 10 merely that both extend a distance from the edge 16 adequate to provide the desired moisture resistance and contact area for adhesion to the sealing member 40. Similarly, the distance d2 on the cover 50 need not be identical to the distance d2 on the substrate 10, merely that the distance d2 on the cover 50 extend a distance on the cover 50 from the distance d1 on the cover 50 and distance d2 on the substrate 10 extend a distance on the substrate 10 from the distance d1 on the substrate 10 adequate to provide the desired moisture resistance. However, in various embodiments of the present invention, the distance d1 on the cover 50 is substantially the same as the distance d1 on the substrate 10 or the distance d2 on the cover 50 is substantially the same as the distance d2 on the substrate 10 or both. By substantially is meant that one of the first (or second) strips 80, 82, 30, 32 is within 50% of the width of the other first (or second) strip 30, 32, 80, 82. Electrode 22 and OLED material 20 are formed on the interior substrate surface 12 of the substrate 10.

Figure 2:
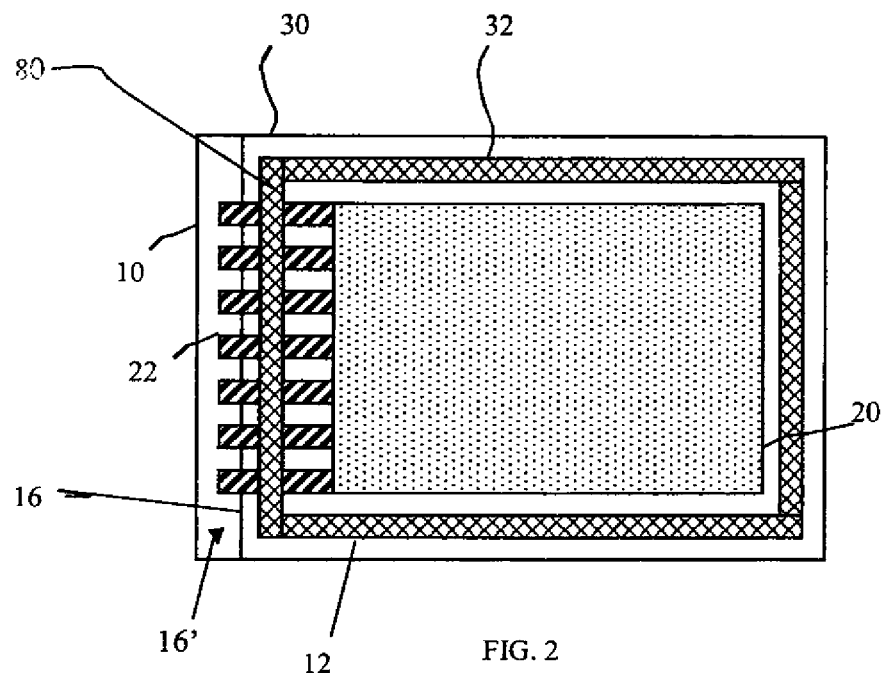
FIG. 2 shows a top view of an OLED device according to an embodiment of the present invention.
Figure 6:
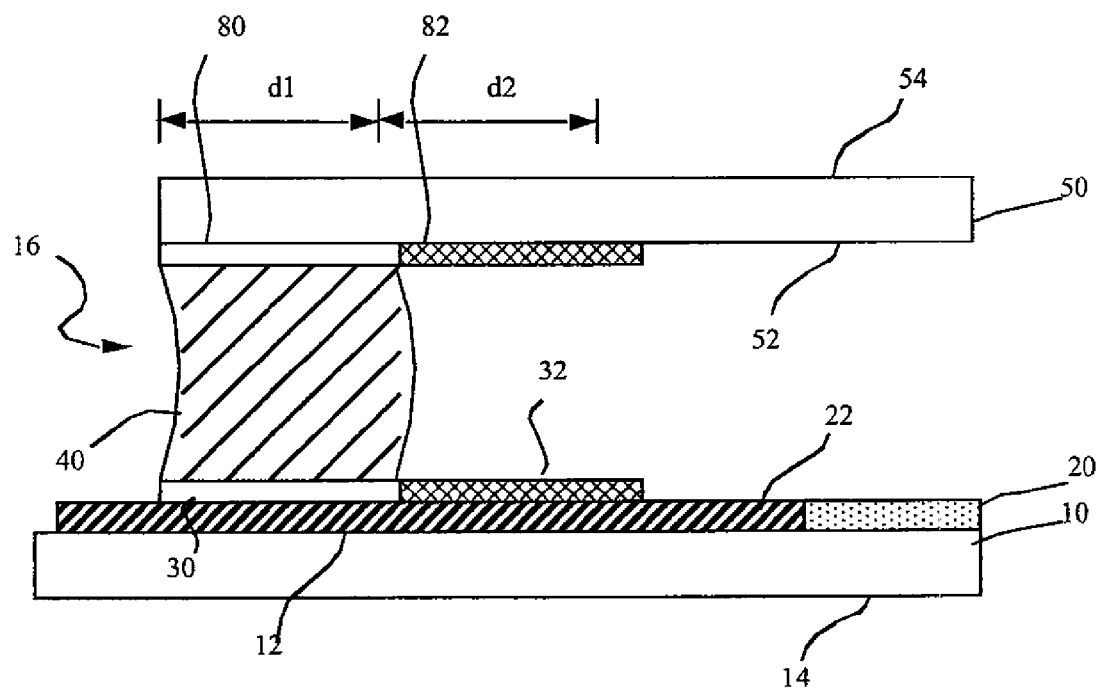
FIG. 6 shows a partial cross-section of the edge of an OLED device with an extended electrode according to an embodiment of the present invention.
Figure 7:
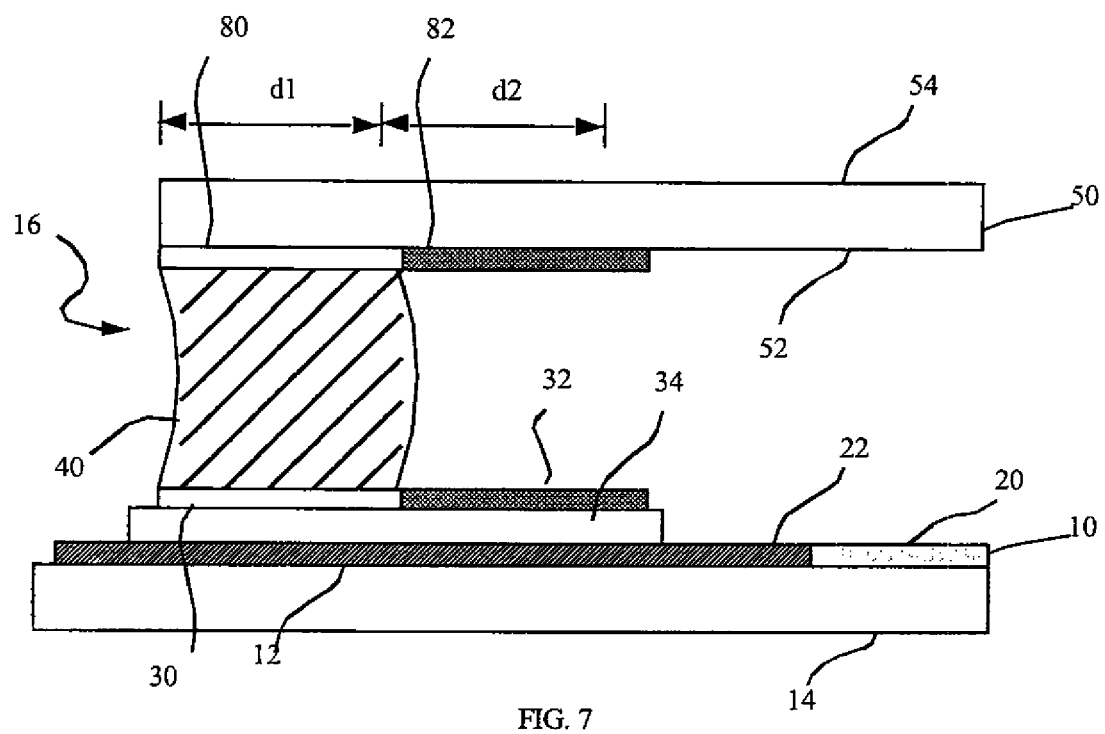
FIG. 7 shows a partial cross-section of the edge of an OLED device with an extended electrode and insulator according to an embodiment of the present invention.
Figure 8:
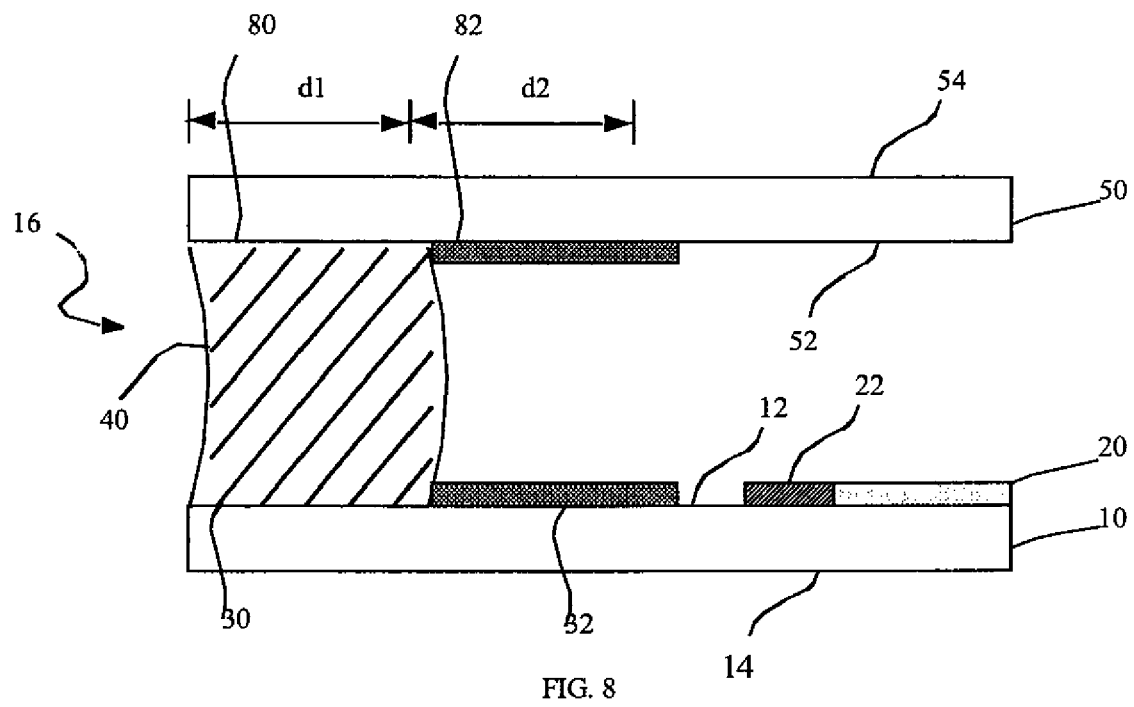
FIG. 8 shows a partial cross-section of the edge of an OLED device according to an embodiment of the present invention.

OLED devices are driven through electrodes that are conventionally electrically connected to a controller exterior to the OLED device. To enable such a connection, the electrodes 22 typically extend beyond the cover 50 on one side of the device, as shown in the top view of FIG. 2 and in the cross section of FIG. 6. In this case, the edge 16 from which the first cover and substrate strips 30, 80 extend, is defined as the edge of the cover rather than the corresponding substrate edge 16. The substrate 10 extends beyond the cover edge 16 to provide an area 16' onto which the electrodes 22 extend and from which the electrodes 22 are externally accessible. However, in an embodiment of the present invention, an alternative sealing arrangement can be employed on the edge 16 at which the electrodes 22 are made externally accessible. Since most display devices are rectangular, the sealing mechanism described herein can be employed on one or more of the four edges 16, as shown in FIG. 2, around the entire perimeter. As shown in FIG. 7, in order to avoid any electrical interference or shorting between the sealing member 40, the first or second substrate strips 30, 32, and the electrode 22 (especially in the case in which the sealing member 40 or strips 30, 32 are a metal), an electrode insulation layer 34, can be employed between the sealing member 40 and the electrode 22 in the locations where the electrode 22 extends beneath the sealing member 40. As shown, the electrode 22 extends over the interior substrate surface 12 between the interior substrate surface 12 and the sealing material and the electrode insulation layer 34 is located between the electrode 22 and the sealing member 40. Various embodiments of the present invention can employ different materials for the substrate 10 and cover 50 and for the substrate strips 30, 32 and cover strips 80, 82. For example, the first substrate strip 30 can be an uncoated portion of the substrate 10, or the second substrate strip 32 can be an uncoated portion of the substrate 10, or the first cover strip 80 can be an uncoated portion of the cover 50, or the second cover strip 82 can be an uncoated portion of the cover 50. In one embodiment shown in FIG. 8, the first or second cover strips 80, 82 or substrate strips 30, 32 are the surface of the substrate 10 or cover 50 itself. In such an embodiment, it is useful if the substrate 10, in particular, is insulating so that the electrodes 22 formed thereon conduct electricity along only the desired path. Glass or plastic are good examples of such useful materials. In an alternative embodiment, the first or second cover strips 80, 82 or the first and second substrate strips 30, 32 are formed from a material different than the cover 50 or substrate 10 material (FIG. 1). For example, if a metal is used for the substrate 10, the metal can be coated with a non-conducting material having the desired wetting properties with respect to the sealing member 40.

The sealing member 40, according to various embodiments of the present invention, can be formed of a metal or metal alloy. Particularly useful metals include indium, tin, bismuth, lead, or solder, or alloys of these metals. A particularly useful alloy includes indium and tin in a ratio of 50:50, 52:48, 48:52, 55:45, or 45:55. These materials are useful in part because they have a relatively low melting temperature. As is known in the prior art, OLED materials 20 for example organic temperature-sensitive materials 20 coated on the interior substrate surface 12, can be damaged by heat and the use of low-melting-point metals reduces potential damage to the organic materials in the OLED. Indeed, applicant has demonstrated the use of a metal alloy as a sealing member that has a melting point lower than a temperature at which the coated OLED materials are damaged.

Useful materials for the first and second cover strips 80, 82 and first and second substrate strips 30, 32 include metals, metal alloys, and metal oxides, for example copper, aluminum, silver, and aluminum oxide. Resins, for example photosensitive resins used in photo-lithography are also useful in providing differential wetting, particularly in combination with metal or metal alloy sealing materials. In one particular embodiment, the first cover strip 80 and first substrate strip 30 have a glass surface, the second cover strip 82 and second substrate strip 32 have an aluminum oxide surface, and the sealing member 40 is an alloy including tin and indium. In another particular embodiment, the first cover strip 80 and first substrate strip 30 have a metal or metal oxide surface, the second cover strip 82 and second substrate strip 32 have a glass surface, and the sealing member 40 is a solder alloy. In a third embodiment, the first cover strip 80 and first substrate strip 30 have a silver surface, the second cover strip 82 and second substrate strip 32 have an aluminum oxide surface, and the sealing member 40 is an alloy including tin and indium. In general, the requirement is that the sealing member 40 wets the first cover strip 80 and first substrate strip 30 and does not wet the second cover strip 82 and second substrate strip 32.

Figure 3:
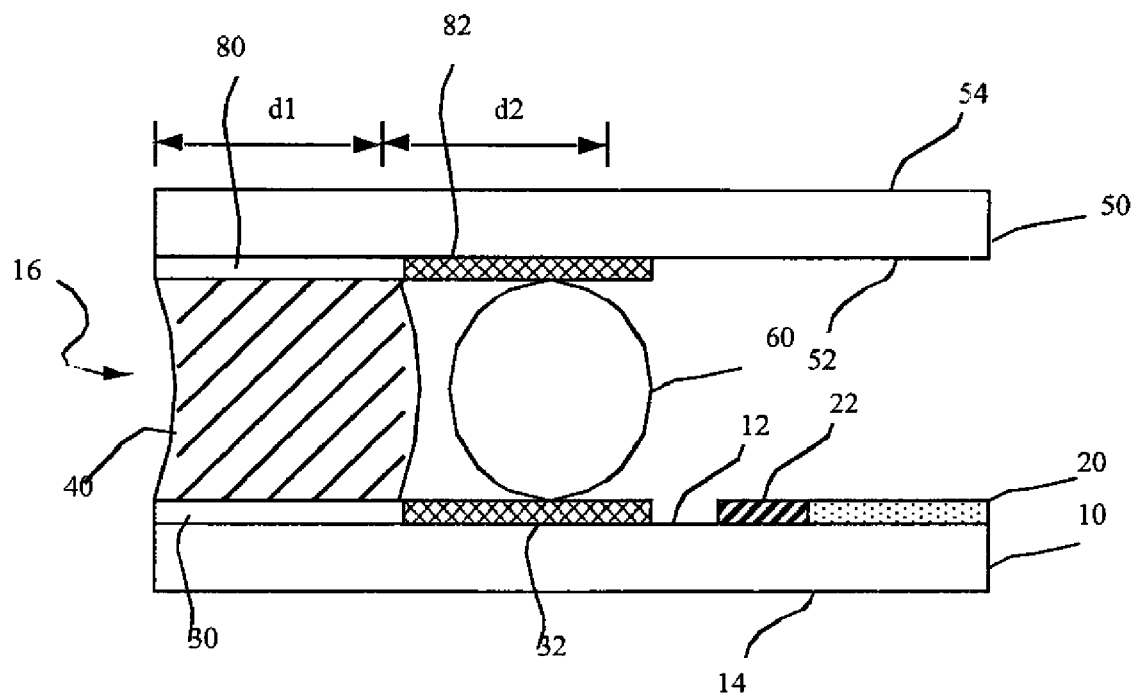
FIG. 3 shows a partial cross-section of the edge of an OLED device according to another embodiment of the present invention.
Figure 4:
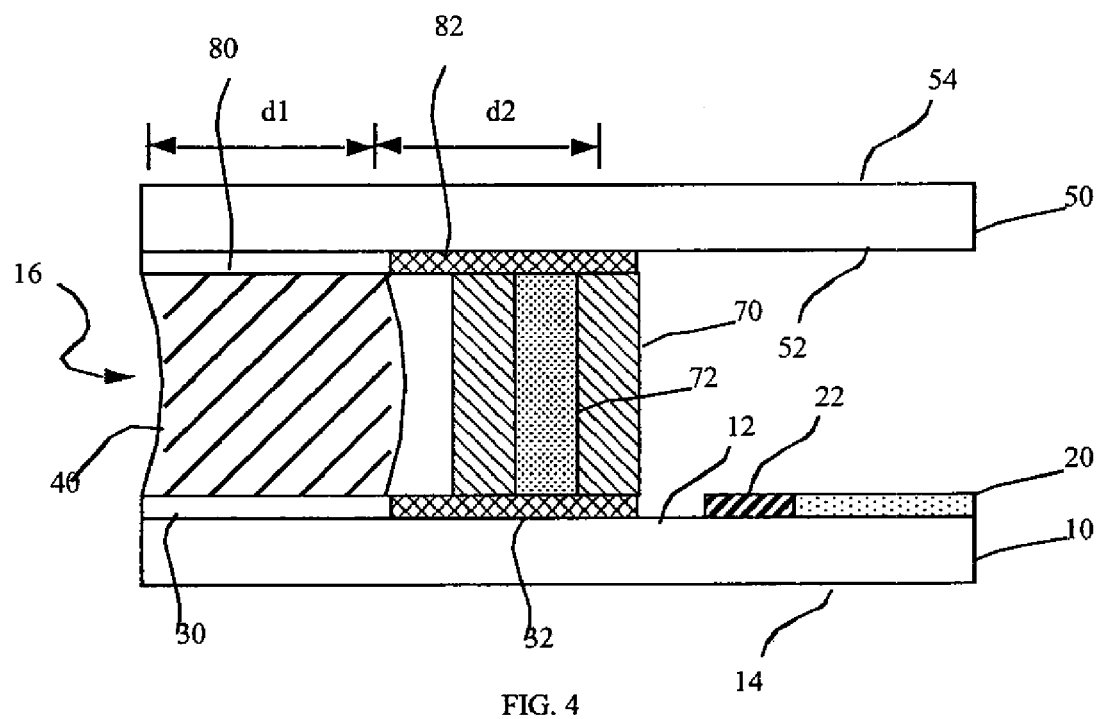
FIG. 4 shows a partial cross-section of the edge of an OLED device according to yet another embodiment of the present invention.

Referring to FIG. 4, in alternative embodiments of the present invention, adhesives and desiccants can also be provided between the interior substrate surface 12 and the interior cover surface 52 to complement the function of the sealing member 40. Typically, the adhesives 72 and desiccants 70 are located between the OLED material 20 and the sealing member 40 and adhere to both second cover strip 82 and second substrate strip 32. Alternatively, the adhesives 72 and desiccants 70 adhere to both the interior substrate surface 12 and the interior cover surface 52. The desiccant 70 usefully absorbs trapped moisture. The adhesive 72 is useful in providing a robust adhesion between the cover 50 and substrate 10 as the sealing member 40 may not necessarily provide adequate adhesion. The desiccants 70 and adhesives 72 (for example, epoxy) can be layered to form one or more barriers as taught in the prior art. In a top-emitter embodiment, the adhesives 72 and desiccants 70 are located at the periphery of the OLED materials 20, while in a bottom emitter, desiccants can be located over the back of the OLED. In order to control the spacing of the cover 50 from the substrate 10 spacer elements 60 (shown in FIG. 3) can be used. The spacer elements 60 may be located in the second cover and substrate areas D2 or may be located farther toward the OLED material 20, for example above the electrodes 22.

Since flat-panel OLED devices typically have a rectangular outline, the sealing member 40 described above can be employed on one or all of the sides of the OLED device (as shown in FIG. 2). Hence, the entire perimeter of the cover 50 and substrate 10 can be sealed with the same sealing member 40. First and second strips 30, 32, 80, 82 having the first and second surface attributes, respectively, can be formed on the interior surfaces of the cover and substrate (52, 12) around the entire perimeter. Alternatively, the sealing member 40 can be employed on only a portion of the perimeter, as can the first and second cover strips 80, 82 and substrate strips 30, 32.

The sealing member 40 of the present invention can be constructed in a variety of ways. In each of these embodiments, the first and second strips 80, 82, 30, 32 are first formed on the cover 50 and substrate 10, for example by sputtering or evaporating materials through a mask, by photolithographic methods, or by simply cleaning the surface of the cover 50 or substrate 10 when the surface is used as the strip. Once the strips 80, 82, 30, 32 are formed, the cover 50 and substrate 10 are adhered in a desired, spaced-apart configuration, for example by employing the spacer dots 60 of FIG. 3 and an adhesive 72. The sealing member 40 can then be formed by dipping the substrate 10 and cover 50 together into molten sealing material, and removing the substrate and cover from the melted sealing material to thereby permit the sealing material to cool and harden. Alternatively, the sealing member 40 can be formed by depositing molten sealing material between the substrate 10 and cover 50 and then permitting the sealing material to cool and harden. In another method, the sealing member 40 can be formed by depositing sealing material between the substrate 10 and cover 50, heating the sealing material and then permitting the sealing material to cool and harden. In this latter case, the sealing material can be applied as a paste or applied as a dispersion, for example a dispersion of conductive nano-particles. If the sealing member 40 is a metal, the sealing material may be applied in a wire form and the sealing member 40 made by positioning a metal wire in the space between the first substrate 30 and first cover strips 80, melting the metal wire, and then cooling the melted material to form the sealing member 40. If the sealing material is not applied as a liquid, the sealing material is heated to form the sealing member 40 and adhere it to the wettable first cover and substrate surfaces to form a hermetic moisture barrier.

Applicant has demonstrated the present invention by employing a glass and cover substrate adhered by a 1 mm spacer. In a first series of experiments, a mixture 50% of indium and 50% tin was melted at a temperature of 128 degrees C. and applied between the glass cover and substrate without a coating on the interior glass surfaces (i.e. the first strip was glass) and shown to coat the glass surface. The edge was subsequently ground to form a polished, smooth, and hermetic seal between the substrate and cover. In a second experiment, the use of a strip of aluminum oxide on a spaced-apart cover and substrate was demonstrated to repel the 50% mixture; that is the strips did not wet. In a third experiment, a first strip was formed with evaporated aluminum on a cover and substrate, the cover and substrate were adhered in a spaced-apart configuration, and the 50% mixture applied as a molten metal. The cover, substrate, and sealing member were subsequently ground to form a hermetic barrier. In a fourth experiment, a variety of molten commercial solders were shown not to wet glass but to wet metal layers, for example formed on glass.

The above experiments were formed by dipping the spaced-apart cover and substrates into a molten pool of metal alloy. In a second series of experiments, the 50% mixture was applied to spaced-apart substrates and covers having the same strips by pouring the material between the spaced-apart cover and substrate to form the sealing barrier. The substrate, cover, and sealing member were subsequently ground and shown to form a hermetic barrier.

Figure 5:
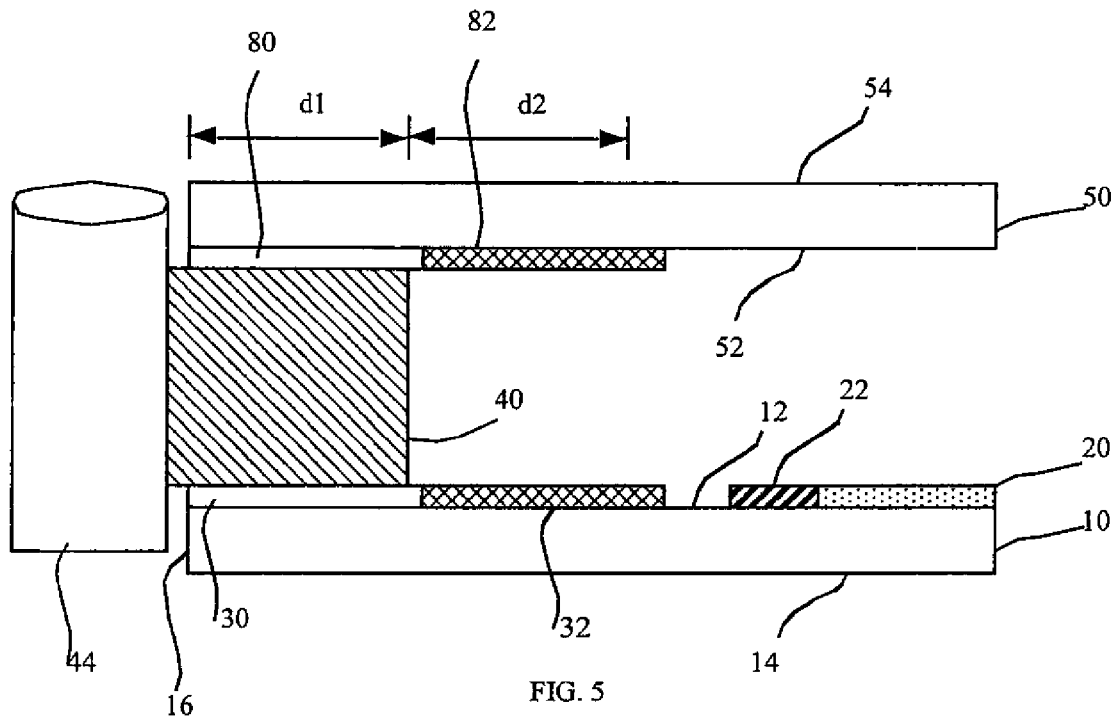
FIG. 5 shows a partial cross-section of the edge of an OLED device and a heating element used to seal the edge according to an embodiment of the present invention.

In practice, dipping the edges of large substrates or otherwise applying liquid metal between the substrate and cover can be difficult since it could be necessary to orient large substrates and covers in a vertical position. In an alternative experiment, the 50% mixture was applied in solid form (for example as a wire) in the first strip area between the spaced-apart substrate and cover having the same strips as described above and subsequently heated with a hot metal surface. FIG. 5 illustrates the process with a local heat applicator 44 (e.g. a roller). The metal sealing member 40 then formed a barrier that was subsequently ground and shown to form a hermetic barrier. In this process, it is helpful if the heated surface does not wet the sealing member, to prevent the sealing member from adhering to the heating surface. In an alternative process, a paste or a dispersion of metal particles can be applied as a solid or a liquid and dried (if necessary) between the spaced-apart substrate and cover in the first strip area. The paste or dispersion can be locally heated to melt the metal particles to form the sealing barrier. In one embodiment, the metal particles are nano-particles having a lower melting temperature than larger metal particles.

The present invention may be employed to provide a hermetic seal to an OLED device. Note that the melting temperature of the 50% mixture, 128 degrees C., is slightly less than the temperature at which the organic materials comprising the OLED device are damaged. Note also that the entire device was not heated, only the local periphery of the OLED device, so that the temperature of organic materials in an OLED device is not necessarily raised to the same temperature as the sealing member.

The present invention can be employed in either top or bottom emitter configurations.

Substrate 10 can be an organic solid, an inorganic solid, or a combination of organic and inorganic solids. Substrate 10 can be rigid or flexible and can be processed as separate individual pieces, such as sheets or wafers, or as a continuous roll. Typical substrate materials include glass, plastic, metal, ceramic, semiconductor, metal oxide, metal nitride, metal sulfide, semiconductor oxide, semiconductor nitride, semiconductor sulfide, carbon, or combinations thereof, or any other materials commonly used in the formation of OLED devices, which can be either passive-matrix devices or active-matrix devices. Substrate 10 can be a homogeneous mixture of materials, a composite of materials, or multiple layers of materials. Substrate 10 can be an OLED substrate that is a substrate commonly used for preparing OLED devices, e.g. active-matrix low-temperature polysilicon or amorphous-silicon TFT substrate. In a useful embodiment, substrate 10 can comprise glass.

The cover 50 can comprise the same or different materials as the substrate 10 and can have the same or different properties. Cover 50 can be an organic solid, an inorganic solid, or a combination of organic and inorganic solids. Protective cover 50 can be rigid or flexible, and can be processed as separate individual pieces, such as sheets or wafers, or as continuous rolls. Typical protective cover materials include glass, plastic, metal, ceramic, semiconductor, metal oxide, metal nitride, metal sulfide, semiconductor oxide, semiconductor nitride, semiconductor sulfide, carbon or combinations thereof. In a useful embodiment, protective cover 50 can comprise glass.

In addition, protective cover 50 can include one or more optically active layers for imparting desirable properties to an OLED device or to its emitted light. Examples of useful optically active layers include color filter arrays for limiting the wavelengths of emitted light, color change modules (e.g. fluorescent layers) for converting a range of wavelengths to another range of wavelengths, light-extraction layers for limiting losses due to total internal reflection, anti-reflection layers, and polarizing layers.

In some embodiments, a polymer buffer layer, which can be any number of materials, including UV or heat cured epoxy resin, acrylates, or pressure sensitive adhesive, can be disposed between the substrate 10 and the protective cover 50.

Typical moisture-absorbing desiccant materials include metals such as alkali metals (e.g. Li, Na), alkaline earth metals (e.g. Ba, Ca), or other moisture-reactive metals (e.g. Al, Fe); alkaline metal oxides (e.g. $Li_2O$, $Na_2O$); alkaline earth metal oxides (e.g. MgO, CaO, BaO); sulfates (e.g. anhydrous $MgSO_4$); metal halides (e.g. $CaCl_2$); perchlorates (e.g. $Mg(ClO_4)_2$); molecular sieves, especially molecular sieves treated at high temperature; organometallic compounds described by Takahashi et al. in U.S. Pat. No. 6,656,609 and by Tsuruoka et al. in U.S. Patent Application 2003/0110981. Desiccant material 70 can be a single material, a homogeneous mixture of materials, a composite of materials, or multiple layers of materials, and can be deposited from a vapor or from solution, or can be provided as particulate material or as particulate material formed in a porous matrix such as a permeable package or tape. Particularly useful desiccant materials include those that are particulate materials formed into a polymeric matrix that can be patterned, as described by Boroson et al. in U.S. Pat. No. 6,226,890. The desiccant materials can be expanding or non-expanding desiccants. By an expanding desiccant, we mean a desiccant that expands in volume upon absorbing moisture. Examples of expanding desiccants include reactive metals such as Li and oxides such as CaO. Such desiccants should not fill the entire space between the substrate and cover. One advantage of non-expanding desiccants, such as molecular sieves, is that they can fill the entire space.

OLED devices that can be used in this invention have been well described in the art and OLED devices can include layers commonly used for such devices. A bottom electrode is formed over OLED substrate 10 and is most commonly configured as an anode, although the practice of this invention is not limited to this configuration. Example conductors for this application include, but are not limited to, gold, iridium, molybdenum, palladium, platinum, aluminum or silver. Desired anode materials can be deposited by any suitable way such as evaporation, sputtering, chemical vapor deposition, or electrochemical processes. Anode materials can be patterned using well-known photolithographic processes.

While not always necessary, it is often useful that a hole-transporting layer be formed and disposed over the anode. Desired hole-transporting materials can be deposited by any suitable method such as evaporation, sputtering, chemical vapor deposition, electrochemical processes, thermal transfer, or laser thermal transfer from a donor material. Hole-transporting materials useful in hole-transporting layers are well known to include compounds such as an aromatic tertiary amine, where the latter is understood to be a compound containing at least one trivalent nitrogen atom that is bonded only to carbon atoms, at least one of which is a member of an aromatic ring.

The hole-transporting layer in an OLED device can be formed of a single or a mixture of aromatic tertiary amine compounds. Specifically, one can employ a triarylamine in combination with a tetraaryldiamine. When a triarylamine is employed in combination with a tetraaryldiamine, the latter is positioned as a layer interposed between the triarylamine and the electron-injecting and transporting layer. Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate), also called PEDOT/PSS.

Light-emitting layers produce light in response to hole-electron recombination. The light-emitting layers are commonly disposed over the hole-transporting layer. Desired organic light-emitting materials can be deposited by any suitable technique such as evaporation, sputtering, chemical vapor deposition, electrochemical processes, or radiation thermal transfer from a donor material. Useful organic light-emitting materials are well known. As more fully described in U.S. Pat. Nos. 4,769,292 and 5,935,721, the light-emitting layers of the OLED element comprise a luminescent or fluorescent material where electro-luminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

The host material in the light-emitting layers can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distyrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxypolyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful to include an electron-transporting layer disposed over the light-emitting layers. Desired electron-transporting materials can be deposited by any suitable method such as evaporation, sputtering, chemical vapor deposition, electrochemical processes, thermal transfer, or laser thermal transfer from a donor material. Preferred electron-transporting materials for use in the electron-transporting layer are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Certain benzazoles are also useful electron-transporting materials. Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials known in the art.

An upper electrode most commonly configured as a cathode is formed over the electron-transporting layer, or over the light-emitting layers if an electron-transporting layer is not used. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

An OLED device can include other layers as well. For example, a hole-injecting layer can be formed over the anode, as described in U.S. Pat. No. 4,720,432, U.S. Pat. No. 6,208,075, EP 0 891 121 A1, and EP 1 029 909 A1. An electron-injecting layer, such as alkaline or alkaline earth metals, alkali halide salts, or alkaline or alkaline earth metal-doped organic layers, can also be present between the cathode and the electron-transporting layer.

The invention has been described in detail with particular reference to certain preferred embodiments thereof, but it will be understood that variations and modifications can be effected within the spirit and scope of the invention.

PARTS LIST d1 first cover or substrate distance
d2 second cover or substrate distance
10 substrate
12 interior substrate surface
14 exterior substrate surface
16 edge
16' area
20 OLED material
22 electrode
30 first substrate strip
32 second substrate strip
34 electrode insulation layer
40 sealing member
44 local heat applicator
50 protective cover
52 interior cover surface
54 exterior cover surface
60 spacer element
70 desiccant material
72 adhesive sealant
80 first cover strip
82 second cover strip

The invention claimed is:

1. A hermetic seal for a device, comprising:
  a) a substrate having an interior substrate surface, an exterior substrate surface, and the device being formed within the perimeter over the interior substrate surface;
  b) a first substrate strip having a first surface wettability located on the interior substrate surface between the device and the perimeter;
  c) a second substrate strip having a second surface wettability different from the first surface wettability located on the interior substrate surface between the device and the first substrate strip and in contact with the first substrate strip;
  d) a first cover strip having the first surface wettability spaced from the first substrate strip within the perimeter;
  e) a second cover strip having the second surface wettability spaced from the second substrate strip in contact with the first cover strip;
  f) a sealing member that wets the first substrate strips and first cover strips but not the second substrate strips and second cover strips, adhered to the first substrate strips and first cover strips having the first surface wettability and does not adhere to the second substrate strips and second cover strips having the second surface wettability; and
  g) a cover disposed over and in direct contact with the first and second cover strips.

2. The seal of claim 1, wherein the first or second cover or substrate strips are formed from a material different than the cover or substrate material.

3. The seal of claim 1, wherein the first substrate strip is an uncoated portion of the substrate.

4. The seal of claim 1, wherein the second substrate strip is an uncoated portion of the substrate.

5. The seal of claim 1, wherein the first cover strip is an uncoated portion of the cover.

6. The seal of claim 1, wherein the second cover strip is an uncoated portion of the cover.

7. The seal of claim 1, wherein the sealing member is formed of a metal or metal alloy.

8. The seal of claim 4, wherein the metal alloy includes indium, tin, bismuth, lead, or solder or wherein the metal alloy includes indium and tin in a ratio of 50:50, 52:48, 48:52, 55:45, or 45:55.

9. The seal of claim 1, wherein the device includes organic temperature-sensitive materials and wherein the melting point of the material forming the seal is lower than the temperature at which the organic temperature-sensitive materials are damaged.

10. The seal of claim 1, wherein the first or second cover or substrate strip is coated with a metal, a metal oxide, silver, copper, aluminum oxide, or resin.

11. The seal of claim 1, wherein the first cover and substrate strip includes a glass, silver, or copper surface, the second cover and substrate strip includes an aluminum oxide or resin surface, and the sealing material is an alloy including tin and indium.

12. The seal of claim 1, wherein the first cover and substrate strip includes a metal or metal oxide surface, the second cover and substrate strip includes a glass surface, and the sealing material is a solder alloy.

13. The seal of claim 1, wherein the first substrate strip and the first cover strip substantially have the same width or wherein the second substrate strip and the second cover strip substantially have the same width.

14. The seal of claim 1, further includes an electrode and wherein the electrode extends over the interior substrate surface between the interior substrate surface and the seal, and an electrode insulation layer located between the electrode and the seal.

15. The seal of claim 1, further comprising adhesives and desiccants provided between the interior substrate surface and the interior cover surface.

16. A method of making the sealing member of claim 1 by dipping the substrate and cover into molten sealing material and then removing the substrate and cover to thereby permit the sealing material to cool and harden.

17. A method of making the sealing member of claim 1 by depositing molten sealing material between the substrate and cover and then permitting the sealing material to cool and harden.

18. A method of making the sealing member of claim 1 by depositing sealing material between the substrate and cover, heating the sealing material, and then permitting the sealing material to cool and harden.

19. A method of making the sealing member of claim 1 by applying a sealing material as a paste or as a dispersion.

20. A method of making the sealing member of claim 1 by positioning a metal wire in the space between the first substrate and first cover strips, melting the metal wire, and cooling the melted material to form the sealing member.

* * * * *